(12) United States Patent
Erickson et al.

(10) Patent No.: US 8,895,436 B2
(45) Date of Patent: Nov. 25, 2014

(54) IMPLEMENTING ENHANCED POWER SUPPLY DISTRIBUTION AND DECOUPLING UTILIZING TSV EXCLUSION ZONE

(71) Applicant: International Business Machines Corporation, Armonk, NY (US)

(72) Inventors: Karl R. Erickson, Rochester, MN (US); Phil C. Paone, Rochester, MN (US); David P. Paulsen, Dodge Center, MN (US); John E. Sheets, II, Zumbrota, MN (US); Gregory J. Uhlmann, Rochester, MN (US); Kelly L. Williams, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/705,652

(22) Filed: Dec. 5, 2012

(65) Prior Publication Data
US 2014/0151896 A1 Jun. 5, 2014

(51) Int. Cl.
| H01L 21/44 | (2006.01) |
| H01L 23/48 | (2006.01) |
| H01L 23/528 | (2006.01) |
| H01L 21/768 | (2006.01) |

(52) U.S. Cl.
CPC ........ *H01L 21/76802* (2013.01); *H01L 23/481* (2013.01); *H01L 23/5286* (2013.01)
USPC ............................ 438/666; 438/667; 257/621

(58) Field of Classification Search
CPC ................................................ H01L 21/76805
USPC .......... 438/667, 666, 598, 599; 257/E21.597, 257/775, 521
See application file for complete search history.

(56) References Cited

U.S. PATENT DOCUMENTS

| 5,444,021 | A |  | 8/1995 | Chung et al. | |
| 5,904,565 | A |  | 5/1999 | Nguyen et al. | |
| 2002/0022342 | A1 |  | 2/2002 | Schneegans et al. | |
| 2002/0030277 | A1 |  | 3/2002 | Chu et al. | |
| 2005/0230813 | A1 | * | 10/2005 | Nakamura et al. | 257/698 |
| 2009/0302480 | A1 | * | 12/2009 | Birner et al. | 257/774 |
| 2010/0127345 | A1 | * | 5/2010 | Sanders et al. | 257/528 |
| 2011/0031581 | A1 | * | 2/2011 | West | 257/508 |
| 2011/0221070 | A1 | * | 9/2011 | Yen et al. | 257/774 |

FOREIGN PATENT DOCUMENTS

| JP | 11297818 | 10/1999 |
| JP | 2011044599 | 3/2011 |

* cited by examiner

*Primary Examiner* — Caridad Everhart
(74) *Attorney, Agent, or Firm* — Joan Pennington

(57) ABSTRACT

Methods and structures implement enhanced power supply distribution and decoupling utilizing Through-Silicon-Via (TSV) exclusion zone areas for contacting one or more metal wiring layers on a semiconductor chip. A first wiring level in the TSV exclusion zone area includes a first wiring shape having a first hole of a first diameter. A dielectric includes second hole of a second diameter larger than the first diameter is provided above the first wiring level concentric with the first hole. A via hole extends through the first and second holes and an etch is performed to expose a top surface portion of the first wiring shape. A thin oxide is grown over the entire bore of the hole; an anisotropic etch is provided to remove horizontal portions of the thin oxide, exposing wiring shapes. The via hole is filled with a selected material to make TSV electrical connection to the exposed wiring shape.

18 Claims, 6 Drawing Sheets

IMPLEMENTING ENHANCED POWER SUPPLY DISTRIBUTION AND DECOUPLING UTILIZING TSV EXCLUSION ZONE

FIELD OF THE INVENTION

The present invention relates generally to the data processing field, and more particularly, relates to a method and structures for implementing enhanced power supply distribution and decoupling utilizing Through-Silicon-Via (TSV) exclusion zone.

DESCRIPTION OF THE RELATED ART

Through-Silicon-Via (TSV) or TSV interconnections are used for various semiconductor chips and semiconductor chip stacking devices. Integrated circuit die stacking with packaging through silicon via (TSV) interconnections and other packaging techniques enable interconnecting die in ultra close proximity using the vertical dimension. These arrangements enable higher performance and packaging density.

Through Silicon Via chip stack implementations are proving to be powerful system integration tools. Unfortunately, the TSV has large area implications on the die containing the vias or TSVs that extend to the next die. Not only is a large via area consumed but a significant exclusion zone is required around the TSV itself. In the TSV exclusion zone, neither transistors nor functionally limiting wires are allowed and the TSV exclusion zone is a large area.

A need exists for an effective mechanism and method of implementing enhanced power supply distribution and decoupling utilizing the TSV exclusion zone.

SUMMARY OF THE INVENTION

Principal aspects of the present invention are to provide a method and structures for implementing enhanced power supply distribution and decoupling utilizing Through-Silicon-Via (TSV) exclusion zone. Other important aspects of the present invention are to provide such method and structures substantially without negative effects and that overcome many of the disadvantages of prior art arrangements.

In brief, a method and structures are provided for implementing enhanced power supply distribution and decoupling utilizing Through-Silicon-Via (TSV) exclusion zone areas with a method of contacting one or more metal wiring layers on a semiconductor chip. A first wiring level is provided in the TSV exclusion zone area having a first wiring shape having a hole of a first diameter. A dielectric above the first wiring level is provided with a second hole concentric with the first hole having a second diameter larger than the first diameter. A via hole extends through the first and second holes and an anisotropic oxide etch is performed to expose a top surface portion of the first wiring shape. A thin oxide is grown over the entire bore of the hole; an anisotropic etch is provided to remove horizontal portions of the thin oxide, exposing wiring shapes. The via hole is filled with an electrically conducting material to make TSV electrical connection to the exposed wiring shape.

In accordance with features of the invention, the exposed wiring shape optionally provides a voltage supply rail connection of either voltage supply rail VDD or ground GND potential.

In accordance with features of the invention, the conductive via fill is selectively encircled by loops of either voltage supply rail VDD or ground GND wires.

In accordance with features of the invention, a ground GND loop around the conductive via fill connected to a TSV voltage supply rail VDD provides a significant increase in decoupling capacitance.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and structures are provided for implementing enhanced power supply distribution and decoupling utilizing Through-Silicon-Via (TSV) exclusion zone.

Figure 1:
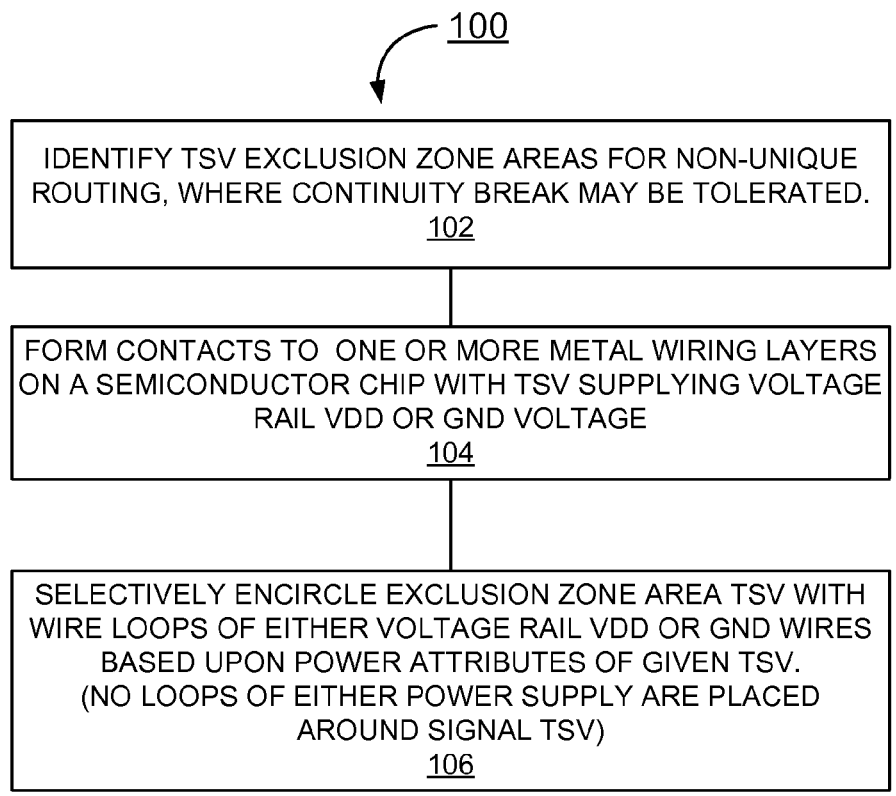
FIG. 1 is a flow chart illustrating exemplary steps for implementing enhanced power supply distribution and decoupling utilizing Through-Silicon-Via (TSV) exclusion zone areas in accordance with a preferred embodiment.

Referring now to FIG. 1, there is shown a flow chart illustrating exemplary steps generally designated by the reference character 100 for implementing enhanced power supply distribution and decoupling utilizing Through-Silicon-Via (TSV) exclusion zone in accordance with a preferred embodiment. As indicated in a block 102, TSV exclusion zone areas are identified for non-unique routing, where a continuity break can be tolerated. This break occurs, for example, in instances where the TSV is at maximum size and is at the maximum misalignment to the underlying metal planes. Such continuity break typically occurs only in this extreme situation and then only on the side of the TSV center suffering the greatest encroachment into the exclusion area.

In accordance with features of the invention, TSV defined areas are circled with loops of either Vdd or GND wires; depending on the power attributes of a given via. By encircling a Vdd TSV with ground wire rings into the exclusion zone ground distribution is improved significantly in area where the via does not consume the entire area to the exclusion zone edge. The ground buses therefore exists on either side of the TSV and are contiguous; just as in designs predating the TSV introduction. Similarly, one rings the Vdd TSV with Vdd wires; and in this case extending them farther into the exclusion zone. In addition, significant increases in decoupling capacitance are afforded by the ground loop around same Vdd TSV. Similarly, Vdd loops are placed around the TSV supplying GND voltage. No loops of either power supply are placed around signal TSV.

Ideally, one can make either decoupling loops or power supply connections to all TSV dedicated to power distribution. For example, the TSV width is on the order of 400 wire pitches, depending on the metal plane in question, so a potential ring of power routing of the same power potential is always available. One could choose to make connection to the power TSV at each plane or make a decoupling loop around the power TSV; at least one of those two will always be available and almost certainly either is possible at each metal plane around each TSV, even the very high number of wires within the TSV cross section.

As indicated in a block 104, contacts are formed to one or more metal wiring layers on a semiconductor chip with the TSV supplying voltage rail VDD or ground GND voltage, for example, as illustrated and described with respect to FIGS. 2, 3, 4, and 5. As indicated in a block 106, the TSV exclusion zone area is selectively encircled with loops of either voltage rail VDD or GND wires based upon the power attributes of a given TSV. No loops of either power supply are placed around a signal TSV at block 106.

Referring now to FIGS. 2, 3, 4, and 5, there are schematically shown not to scale respective example TSV exclusion zone area processing steps of a method of contacting one or more metal wiring layers on a semiconductor chip in accordance with the preferred embodiments.

Figure 2:
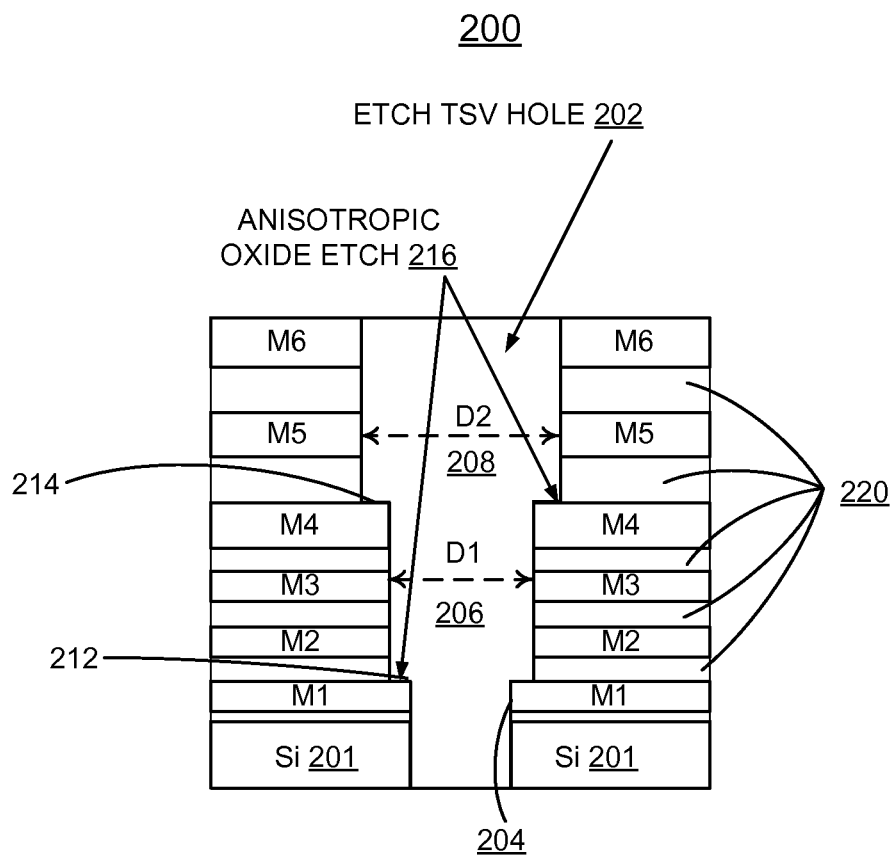
FIGS. 2, 3, 4, and 5 schematically illustrate not to scale respective example TSV exclusion zone area processing steps of a method of contacting one or more metal wiring layers on a semiconductor chip in accordance with preferred embodiments.

In FIG. 2, in first processing steps generally designated by the reference character 200, a Through-Silicon-Via (TSV) hole 202 is etched through a plurality of metal layers M1-M6 and a semiconductor substrate 201 formed of a suitable material such as a silicon substrate 201. Etching the TSV 202 includes masking a Through-Silicon-Via (TSV) region and etching said Through-Silicon-Via (TSV). The TSV 202 is a stepped opening with a base opening 204 etched to extend through the silicon wafer or die 201 and the metal layers M1-M6. The TSV 202 is etched to provide a hole 206 of a first diameter D1 at a first wiring level M1 having a first wiring shape 212, and a hole 208 of a second diameter D2 at a second wiring level M4 above the first wiring level M1 having a second wiring shape 214. An anisotropic oxide etch generally designated by the reference character 216 is performed to expose a top surface portion 212 for the first wiring shape 212 of metal layer M1 and a top surface portion 214 for the second wiring shape 214. A dielectric material 220 is provided between adjacent ones of the plurality of metal layers M1-M6.

Figure 3:
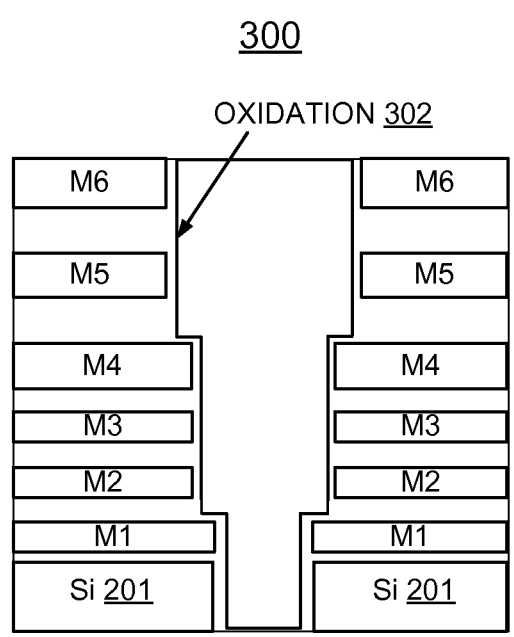

FIG. 3 illustrates a next processing step generally designated by the reference character 300. A thin oxide is grown over the entire bore of the TSV 202 as indicated by an oxidation step 302. It should be understood that these regions need not be rectangular, and will likely include some circular or elliptical geometry. These differences do not significantly affect or reduce the advantages of the invention.

Figure 4:
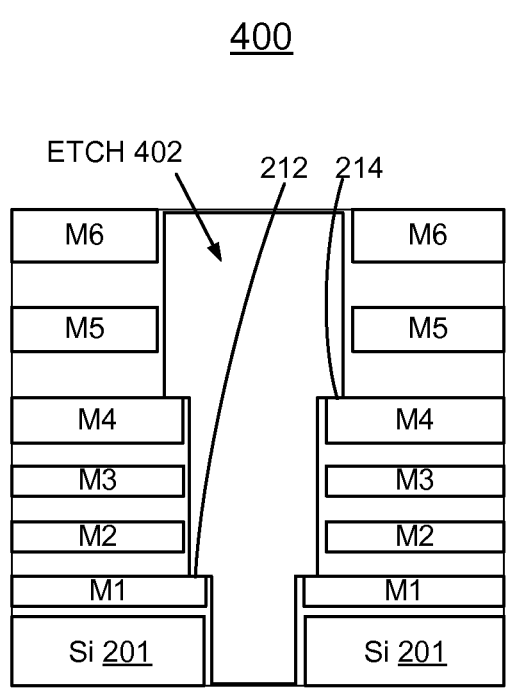

FIG. 4 illustrates a next processing step generally designated by the reference character 400. In FIG. 4, an anisotropic oxide etch generally designated by the reference character 402 is performed to remove horizontal portions of the thin oxide exposing the first wiring shape 212 of metal layer M1 and the second wiring shape 214 of metal layer M4.

Figure 5:
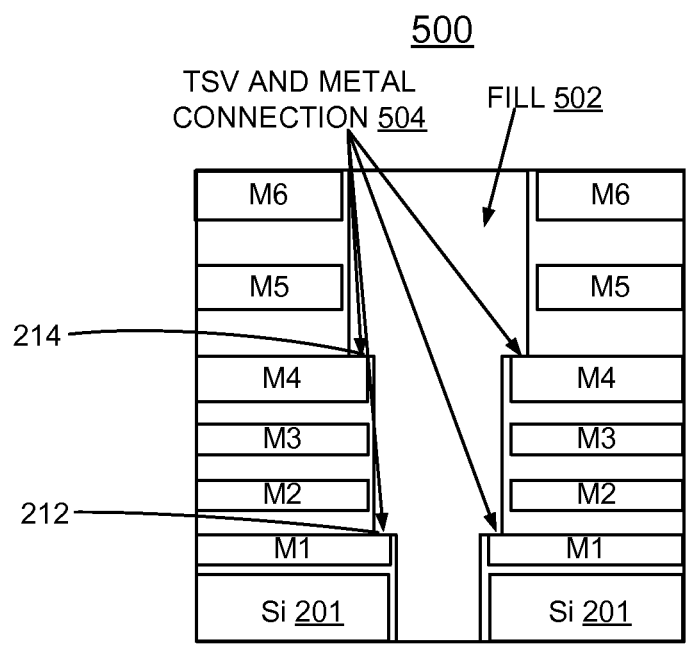

In FIG. 5, next processing steps are generally designated by the reference character 500. In a fill step generally designated by the reference character 502, the TSV hole 202 is filled with a suitable electrically conductive material, for example, of titanium, copper, tungsten, aluminum, Al (Cu), or other conventional conductive material used for TSVs. A TSV and metal connection 504 is made by the TSV fill 502 and the exposed wiring shapes 212, 214 of the metal layers M1, and M4.

In accordance with features of the invention, a selected set of wiring levels is provided for a particular application. It should be understood that the present invention is not limited to the illustrated arrangements of FIGS. 2-5. It should be understood that in accordance with features of the invention one or more exposed wiring shapes of a respective interior metal layer have the TSV and metal connection. For example, only the exposed top surface portion 212 for the first wiring shape 212 of metal layer M1 could be used with the top metal layer M6 without providing a second exposed wiring shape of another interior metal layer, such as without the providing the exposed top surface portion 214 for the first wiring shape 214 of metal layer M4 with the second hole diameter D2 208. Also, multiple exposed top surfaces potions for each of the interior metal layers M1-M5 could be provided for TSV and metal connection in accordance with features of the invention. A particular application can include a single interior exposed wiring shape of one interior metal layers having the TSV and metal connection, for example, as illustrated and described with respect to FIG. 6.

Figure 6:
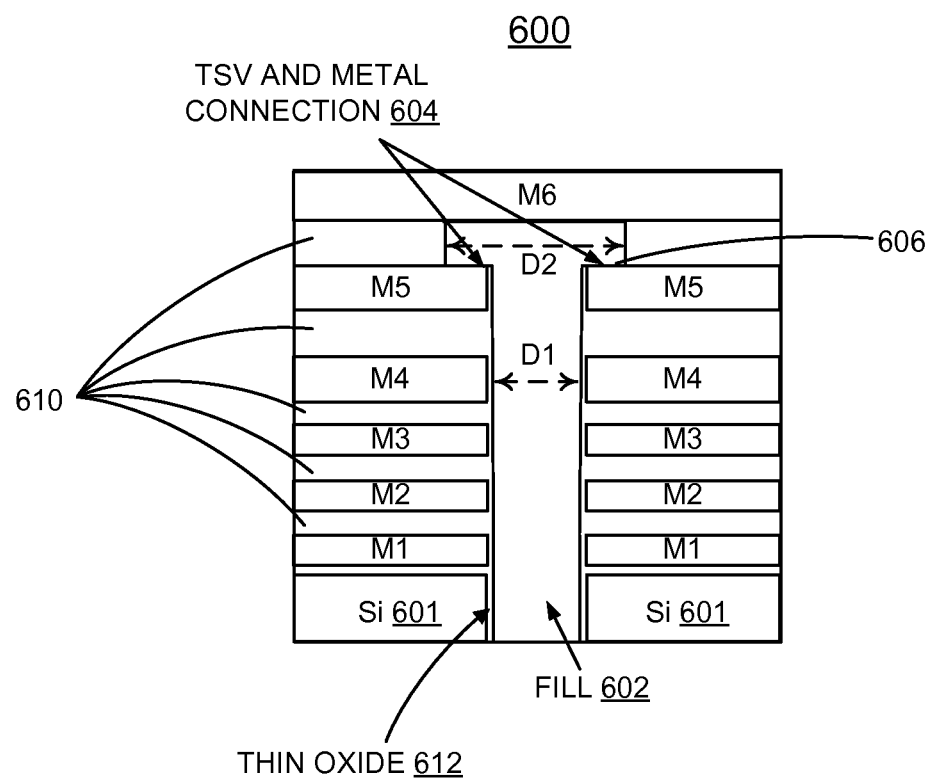
FIG. 6 schematically illustrates not to scale another example TSV exclusion zone area structure for implementing enhanced power supply distribution and decoupling utilizing Through-Silicon-Via (TSV) exclusion zone areas in accordance with a preferred embodiment.

Referring now FIG. 6, there is shown another example structure generally designated by the reference character 600 for implementing enhanced power supply distribution and decoupling utilizing Through-Silicon-Via (TSV) exclusion zone in accordance with a preferred embodiment. Processing steps as illustrated in FIGS. 1-5 advantageously implement structure 600 in accordance with a preferred embodiment.

Structure 600 includes a fill 602 and a TSV and metal connection 604 that is made by the TSV fill 602 with an exposed wiring shape 606 of the metal layer M5. A dielectric material 610 is provided between adjacent ones of the plurality of metal layers M1-M6. A thin oxide layer 612 is provided in the via hole between the substrate 601 and the plurality of metal layers M1-M6, and the TSV fill 602. The TSV fill 602 has a first diameter D1 extending through the silicon layer 601 and the metal layers M1-M5. The TSV fill 602 has a second diameter D2 concentric with and larger than the first diameter D1 extending through the dielectric 610 above the metal layer M5 to make the TSV and metal connection 604 to the metal wiring shape of the metal layer M5 and a metal connection the upper metal layer M6. Fill 602 is a suitable electrically conductive material, for example, of titanium, copper, tungsten, aluminum, Al (Cu), or other conventional conductive material used for TSVs.

While the present invention has been described with reference to the details of the embodiments of the invention shown in the drawing, these details are not intended to limit the scope of the invention as claimed in the appended claims.

What is claimed is:

1. A method for implementing enhanced power supply distribution and decoupling utilizing Through-Silicon-Via (TSV) exclusion zone areas includes a method of contacting one or more metal wiring layers on a semiconductor chip comprising:

providing a first wiring level in the TSV exclusion zone area having a first wiring shape having a hole of a first diameter;

providing a second hole in a dielectric above the first wiring level having a second diameter, the second hole being concentric with the first hole, and the second diameter being larger than the first diameter;

etching a via hole passing through the first and second holes;

performing an anisotropic oxide etch to expose a top surface portion of the first wiring shape and a top surface portion of the second wiring shape;

growing a thin oxide over the via hole;

performing an anisotropic etch to remove horizontal portions of the thin oxide, exposing wiring shapes;

filling the via hole with a conducting material to make electrical connection to the exposed wiring shapes; said conducting material filled via electrically connected to a selected one of voltage supply rail VDD and voltage supply rail ground GND potential; and selectively encircling the filled via hole with wire loops connected to a selected one of voltage supply rail VDD and voltage supply rail ground GND potential based upon power attributes of the filled via hole.

2. The method as recited in claim 1, includes providing a second wiring level above the first wiring level having a second wiring shape including said second hole of said second diameter.

3. The method as recited in claim 1, includes providing the exposed wiring shapes with a voltage supply rail VDD connection.

4. The method as recited in claim 1, includes providing the exposed wiring shapes with a voltage supply rail ground GND potential connection.

5. The method as recited in claim 1, wherein selectively encircling the filled via hole with wire loops connected to a selected one of voltage supply rail VDD and voltage supply rail ground GND potential based upon power attributes of the filled via hole includes selectively encircling the filled via hole connected to voltage supply rail VDD with wire loops of voltage supply rail ground GND potential, providing increased decoupling capacitance.

6. The method as recited in claim 1, wherein selectively encircling the filled via hole with wire loops connected to a selected one of voltage supply rail VDD and voltage supply rail ground GND potential based upon power attributes of the filled via hole includes selectively encircling the filled via hole connected to voltage supply rail ground GND potential with wire loops of voltage supply rail VDD voltage, providing increased decoupling capacitance.

7. The method as recited in claim 1, includes providing a dielectric material between adjacent metal layers.

8. The method as recited in claim 1, wherein etching a via hole passing through the first and second holes includes masking a Through-Silicon-Via (TSV) region and etching said Through-Silicon-Via (TSV).

9. The method as recited in claim 1, wherein filling the via hole with said conducting material to make electrical connection to the exposed wiring shapes includes filling the via hole with a selected electrically conductive material selected from a group including titanium, copper, tungsten, aluminum, and Al (Cu).

10. A structure for implementing enhanced power supply distribution and decoupling utilizing Through-Silicon-Via (TSV) exclusion zone areas on a semiconductor chip comprising:

a substrate;

a plurality of metal layers disposed on said substrate;

a dielectric layer disposed between adjacent ones of said plurality of said metal layers;

at least one of said plurality of said metal layers having a first wiring shape having a hole of a first diameter;

a second hole in a dielectric above the first wiring level having a second diameter, the second hole being concentric with the first hole, and the second diameter being larger than the first diameter;

a conductive via fill extending through said substrate, said plurality of metal layers, and said dielectric layer disposed between adjacent ones of said plurality of said metal layers; said conductive via fill having approximately said first diameter below said dielectric and said conductive via fill having approximately said second diameter proximate said dielectric layer making electrical connection to said first wiring shape; said conductive via fill electrically connected to a selected one of voltage supply rail VDD and voltage supply rail ground GND potential; and wire loops selectively encircling said conductive via fill and connected to a selected one of voltage supply rail VDD and voltage supply rail ground GND potential based upon power attributes of said conductive via fill.

11. The structure as recited in claim 10, wherein said conductive via fill includes an electrically conductive material selected from a group including titanium, copper, tungsten, aluminum, and Al (Cu).

12. The structure as recited in claim 10, wherein said first wiring shape includes a voltage supply rail VDD connection.

13. The structure as recited in claim 10, wherein said first wiring shape includes a voltage supply rail GND potential connection.

14. The structure as recited in claim 10, includes said wire loops of voltage supply rail ground GND potential selectively encircling said conductive via fill connected to voltage supply rail VDD, providing increased decoupling capacitance.

15. The structure as recited in claim 10, includes said wire loops of voltage supply rail ground VDD potential selectively encircling said conductive via fill connected to voltage supply rail VDD potential, providing increased VDD connection area.

16. The structure as recited in claim 10, includes multiple wiring shapes provided with a respective metal level arranged for making electrical connection to said conductive via fill.

17. The structure as recited in claim 10, wherein said conductive via fill includes an electrical connection to an upper one of said plurality of said metal layers.

18. The structure as recited in claim 10, includes a thin oxide layer extending between a sidewall of said conductive via fill, and said substrate and said plurality of metal layers.

* * * * *